(12) United States Patent
Avron et al.

(10) Patent No.: US 10,733,048 B1
(45) Date of Patent: Aug. 4, 2020

(54) MEMORY CONTROLLER WITH PARALLEL ERROR CHECKING AND DECRYPTION

(71) Applicant: Amazon Technologies, Inc., Seattle, WA (US)

(72) Inventors: Itai Avron, Petach Tikva (IL); Adi Habusha, Moshav Alonei Abba (IL); Gal Paikin, Hod Hasharon (IL); Simaan Bahouth, Shfaram (IL)

(73) Assignee: Amazon Technologies, Inc., Seattle, WA (US)

( * ) Notice: Subject to any disclaimer, the term of this patent is extended or adjusted under 35 U.S.C. 154(b) by 57 days.

(21) Appl. No.: 16/219,493

(22) Filed: Dec. 13, 2018

(51) Int. Cl.
| | |
|---|---|
| *H03M 13/00* | (2006.01) |
| *G06F 11/10* | (2006.01) |
| *H03M 13/09* | (2006.01) |
| *H03M 13/15* | (2006.01) |
| *G11C 29/42* | (2006.01) |
| *G11C 29/52* | (2006.01) |
| *G06F 12/14* | (2006.01) |

(52) U.S. Cl.
CPC ...... *G06F 11/1068* (2013.01); *G06F 12/1408* (2013.01); *G11C 29/42* (2013.01); *G11C 29/52* (2013.01); *H03M 13/091* (2013.01); *H03M 13/1515* (2013.01); *H03M 13/6561* (2013.01); *G06F 2212/402* (2013.01); *G06F 2212/403* (2013.01)

(58) Field of Classification Search
CPC . G06F 11/1068; G06F 12/1408; G11C 29/42; G11C 29/52; H03M 13/091; H03M 13/1515
See application file for complete search history.

(56) References Cited

U.S. PATENT DOCUMENTS

| | | | | |
|---|---|---|---|---|
| 2006/0041819 A1* | 2/2006 | Yang | ............ | G11B 20/18 714/758 |
| 2011/0145680 A1* | 6/2011 | Akiyama | ......... | G11B 20/00086 714/769 |
| 2016/0344428 A1* | 11/2016 | Wang | ............ | G09C 1/00 |

* cited by examiner

*Primary Examiner* — Guerrier Merant
(74) *Attorney, Agent, or Firm* — Klarquist Sparkman, LLP

(57) ABSTRACT

A method and circuit are disclosed to calculate an error correction code (ECC) and perform a decryption in parallel when reading memory data. There are multiple modes of operation. In a normal parallel mode of operation, the data passes through a decryption engine. Simultaneously, the same data passes through an ECC decode engine. However, if no error is detected, the output of the decode engine is discarded. If there is an ECC error, an error indication is made so that the corresponding data exiting the decryption engine is discarded. The circuit then switches to a serial mode of operation, wherein the ECC decode engine corrects the data and resends the corrected data again through the decryption engine. The circuit is maintained in the serial mode until a decision is made to switch back to the parallel mode, such as when a pipeline of the ECC engine becomes empty.

20 Claims, 6 Drawing Sheets

MEMORY CONTROLLER WITH PARALLEL ERROR CHECKING AND DECRYPTION

BACKGROUND

Double Data Rate (DDR) memories are popular due to their performance and density. However, to reduce a size of the memory, control of the memory has been offloaded to circuits known as DDR memory controllers. These controller circuits can be located in different places, such as integrated into a processor or a stand-alone Application Specific Integrated Circuit (ASIC) positioned between the processor and the memory.

For accessing memories, such as dynamic random access memory (DRAM), error correction codes (ECCs) can be used to protect against errors and data corruption. In addition, data within the memory can be encrypted. To read the data, the ECC decode occurs first, together with a potential correction of the data due to an ECC error, and then a decryption is performed of the decoded data. Such a process results in latency to perform memory reads and can impact the system performance.

DETAILED DESCRIPTION

A method and circuit are disclosed to calculate an ECC and perform a decryption in parallel. The circuit has multiple modes of operation. In normal parallel mode of operation, the data from a memory passes through a decryption engine. Simultaneously, the same data passes through an ECC decode engine. However, if no error is detected, the output of the decode engine is discarded. If there is an ECC error, an error indication is made so that the corresponding data exiting the decryption engine is discarded. The circuit then switches to a serial mode of operation, wherein the ECC decode engine corrects the data and resends the corrected data again through the decryption engine. The circuit is maintained in the serial mode until such time as a decision is made to switch back to the parallel mode, such as when a pipeline of the ECC engine becomes empty.

Figure 1:
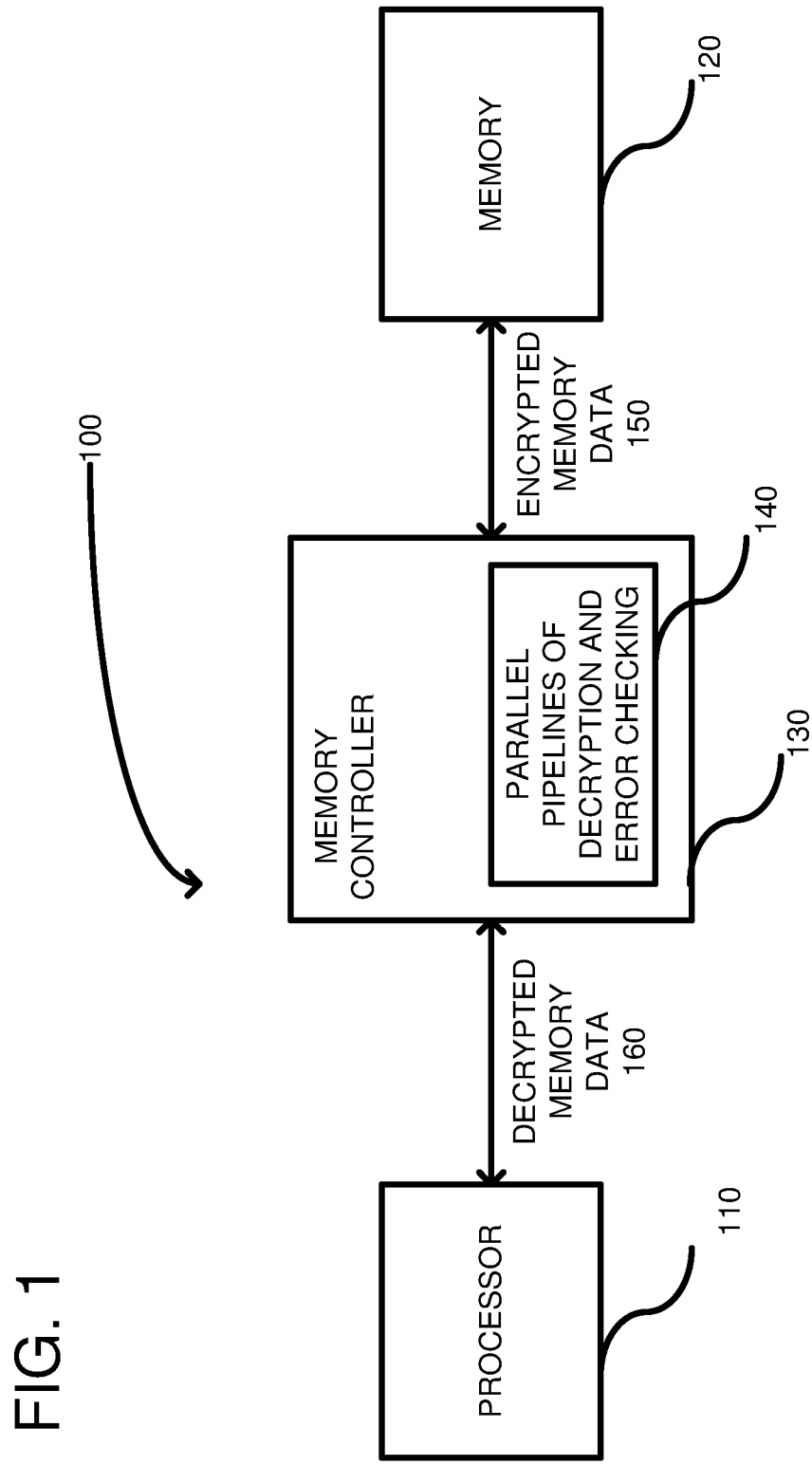
FIG. 1 is a system diagram including a processor accessing a memory through a memory controller, wherein the memory controller includes parallel pipelines for decryption and error checking.

FIG. 1 is an embodiment of a system 100 including a processor 110, a memory 120, and a memory controller 130 positioned between the processor 110 and the memory 120. The memory 120 can be any of a variety of memories that store data including ROM, EEPROM, flash memory, DRAM, SDRAM, etc. The processor can be a general-purpose central processing unit (CPU), a processor in an application-specific integrated circuit (ASIC) or any other type of processor or controller. The memory controller 130 can be a stand-alone integrated circuit (IC) or integrated into the processor 110. Example memory controllers include a double data rate (DDR) memory controller, a dual-channel memory controller, or a flash memory controller. In any case, the memory controller is a digital circuit that manages the flow of data going to and from the memory 120. The memory controller is sometimes called a memory chip controller (MCC) or a memory controller unit (MCU). In the case of DRAM, the memory controller includes logic to read and write to DRAM and to refresh DRAM. In this embodiment, the memory controller 130 includes parallel pipelines of decryption logic and error checking logic 140. The decryption logic transforms encrypted data from the memory 120 into an unencrypted form. The error checking logic is used to perform an ECC check to determine whether the data received from the memory 120 was somehow corrupted. Although an ECC check is generally described herein, other types of error checking can be used, such as a checksum. Additionally, the error checking logic can be used to correct errors within the encrypted memory data. A variety of types of ECCs can be used, including Reed-Solomon, Hamming, etc. Thus, the processor 110 can request data at a predetermined address within the memory 120. In response, the memory 120 can deliver encrypted memory data 150 associated with the address to the memory controller 130. The memory controller 130 can correct the data, if necessary, and decrypt the memory data so as to deliver decrypted data 160 to the processor 110. The parallel pipelines of decryption and error checking shown at 140 provide faster access to the data stored in memory 120.

Figure 2:
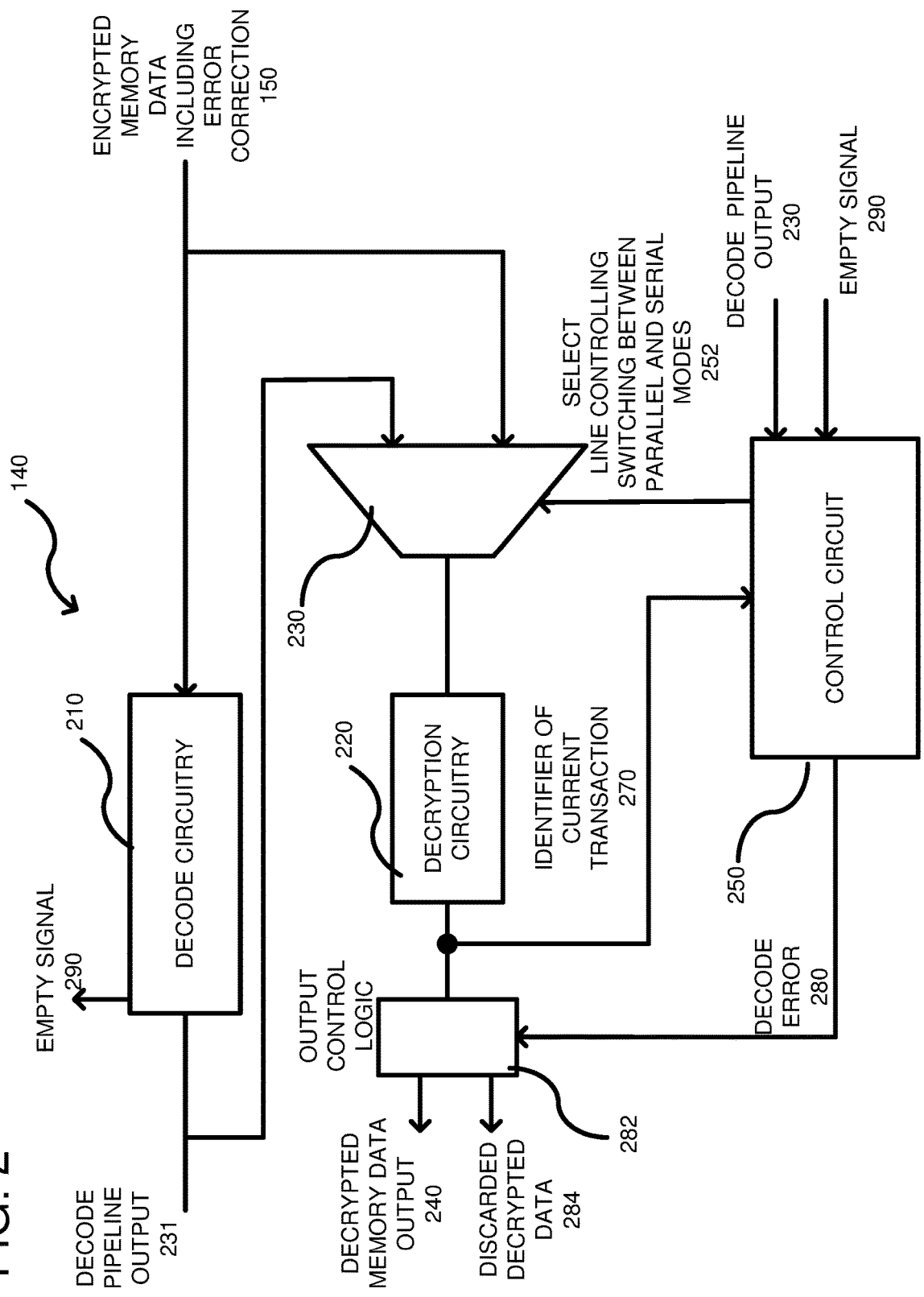
FIG. 2 shows an example embodiment of parallel decode circuitry for error checking and decryption circuitry.

FIG. 2 shows further details of the hardware logic 140 of FIG. 1, according to one embodiment. Encrypted memory data 150 is received from the memory 120 (FIG. 1) and includes error correction information, such as an ECC, for checking whether the encrypted data contains errors. The encrypted memory data 150 is input into both decode circuitry 210 and decryption circuitry 220 in parallel, with a multiplexor 230 allowing the memory data 150 to pass to the decryption circuitry 220 in a parallel operating mode. As described further below, the decode circuitry 210 can analyze the encrypted memory data 150 and determine whether an error exists. Assuming a normal operating mode, the decode circuitry 210 can decode multiple reads associated with different addresses from the memory 120 and can output a decode pipeline output 231 that is disregarded in the case were no error is found. Likewise, in the normal operating mode, the decryption circuitry 220 decrypts the memory data 150 and provides the decrypted memory data on an output 240 for transmission to the processor 110 (FIG. 1). Both the decoding of memory data 150 in the decode circuitry 210 and the decryption in the decryption circuitry 220 can occur in parallel, and depending on the timing, can occur simultaneously.

If the decode circuitry 210 detects an error in the memory data 150, then a flow of the circuit 140 changes from a parallel mode to a serial mode of operation. In the serial mode of operation, the decode circuitry 210 is coupled in series to the decryption circuitry 220 and the decryption circuitry is decoupled from the encrypted memory data 150. Thus, the output 231 of the decode circuitry 210 is input into the decryption circuitry 220. The switching from a parallel mode of operation to a serial mode of operation is controlled by a control circuit 250 via a select line 252 to a multiplexor 230. More particularly, the inputs to the multiplexor 230 include the encrypted data 150 from the memory on one input and the decode output 231 from the decode circuitry on the other input. Thus, the select line 252 allows one of these inputs to pass to the decryption circuitry 220. Shortly after the switching between modes, the decryption circuitry 220 can have two versions of the same data: a first version of the memory data 150 that has an error; and a $2^{nd}$ version of the memory data 150 that has been corrected by the decode circuitry 210. Desirably, the memory data with the error needs to be discarded, which can be controlled by the control circuit 250. Specifically, the control circuit 250 reads the decode pipeline output 231 and determines that an error was detected for a particular identified memory data. The control circuit 250 can receive an identifier 270 associated with each output of the decryption circuitry 220. The control circuit 250 can then determine that the memory data associated with the identifier needs to be discarded. Accordingly, the control circuit 250 issues a decode error 280 to control logic 282, which switches the control logic to discard the decrypted data as indicated at 284. In other embodiments, the decrypted data can simply be blocked within the control logic 282, such as if the control logic is a logic gate (e.g., an OR gate or an AND gate). The corrected data received from the decode circuitry 210 then passes through the decryption circuitry 220. The control circuit 250 changes the error output 280 so as to pass data from the decryption circuitry to the decrypted memory data output 240.

In order to return from the serial mode to the parallel mode, the hardware logic 140 waits for a break in reading data from the memory 120. As a result, at some point the decode circuitry pipeline becomes empty and an empty signal flag 290 is output from the decode circuitry 210. The same signal is input to the control circuit 250, which then can change the select line 252 so as to switch the multiplexor back into a parallel mode of operation. Thus, the hardware logic 140 operates primarily in a parallel mode of operation with reduced latency due to the decode circuitry and the decryption circuitry working in parallel to decrypt memory data. However, once an error occurs, the circuitry switches to a serial mode of operation so as to handle the error. At some desired moment in time, the circuit switches back to the parallel mode of operation so as to increase the overall speed of the circuit.

Figure 3:
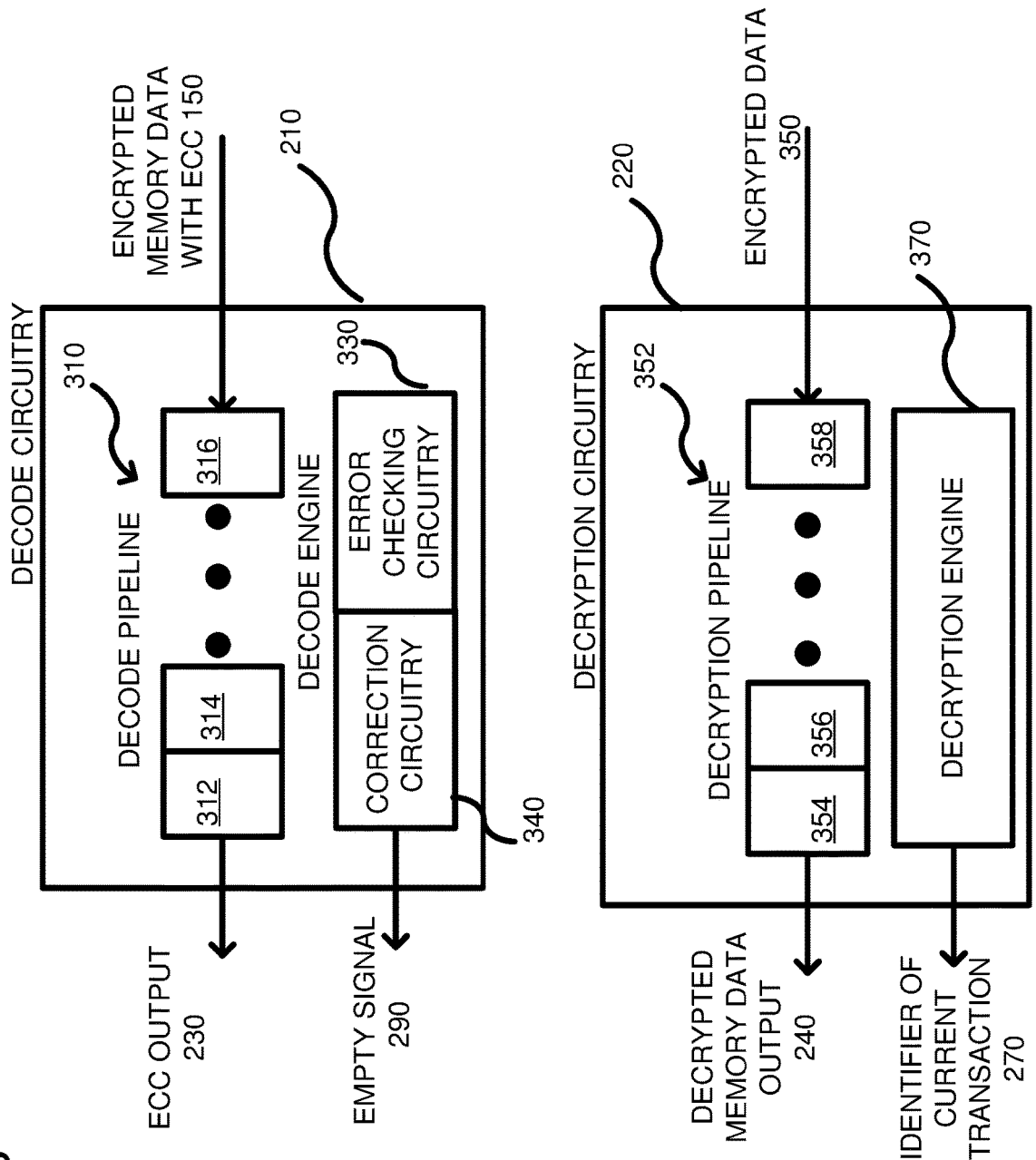
FIG. 3 shows an example embodiment showing parallel pipelines of the decode circuitry and the decryption circuitry.

FIG. 3 shows further details of the decode circuitry 210 and the decryption circuitry 220, according to one embodiment. The decode circuitry 210 includes a decode pipeline 310 including serially coupled memory elements, such as elements 312, 314, and 316 (any number of memory elements can be used depending on the design). In this embodiment, the error code is shown as an ECC code, but other error correction schemes can be used. The encrypted data 150 is received within the pipeline 310 and progresses from the first memory element 316 to the last memory element 312. Error checking circuitry 330 checks to ensure the ECC is correct for the corresponding data. If there is not an error, the memory data can progress through the pipeline 310 and be discarded on the output 231. Alternatively, if the error is correctable, then correction circuitry 340 corrects the data in the pipeline. The control circuit 250 can also include a duplicate error checking circuit 330 or it can receive an error signal from the error checking circuitry 330 so as to know to switch from a parallel to serial mode of operation and discard erroneous data within the decryption circuitry 220. In either case, the decryption circuitry 220 receives some encrypted data 350, which enters into a pipeline shown generally at 352 and which includes memory elements 354, 356 and 358 (any number of memory elements can be used). A decryption engine 370 decrypts the data in the pipeline to transmit unencrypted data on output 240. The decryption engine 370 can also output the identifier 270 associated with the current transaction, should it be needed by the control circuit 250. In the event that the error checking circuitry 330 determines there is an uncorrectable error, then it can alert the control circuit 250 to discard the data from the decryption circuitry 220 and issue a memory read error to the processor 110.

Figure 4:
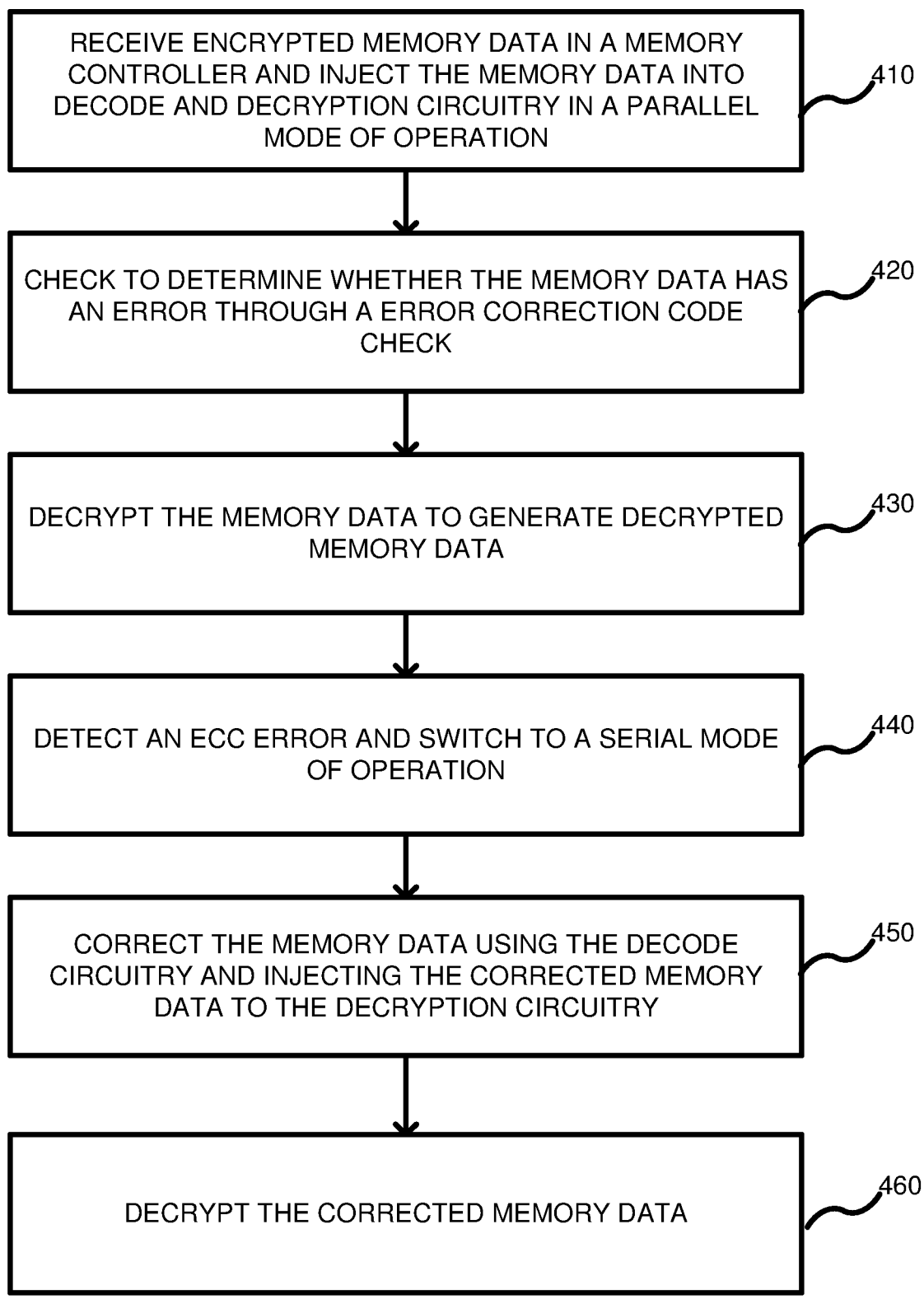
FIG. 4 is a flowchart according to one embodiment for switching from a parallel mode to a serial mode using the decode and decryption circuitry.

FIG. 4 is a flowchart according to one embodiment for error checking and decryption of memory data. In process block 410, encrypted memory data is received in a memory controller and injected or fed into decode and decryption circuitry in parallel during a parallel mode of operation. For example, turning briefly to FIG. 2, encrypted memory data 150 is input in parallel to both the decode circuitry 210 and the decryption circuitry 220 (via the multiplexor 220). In process block 420, a check is made to determine whether the memory data has an error through an error correction code check. For example, turning to FIG. 3, the encrypted memory data 150 can enter the pipeline 310 and is checked by the error checking circuitry 330. In some embodiments, the error checking circuitry 330 checks the memory data for a proper ECC code, which is appended to the encrypted data 150. In process block 430, the memory data is decrypted to generate decrypted memory data. For example, returning to FIG. 3, the encrypted data is input to the decryption pipeline 352 and the decryption engine 370 decrypts the data so as to generate decrypted memory data. In process block 440, an ECC error is detected in the memory data and the circuit switches to a serial mode of operation from a parallel mode of operation. For example, in FIG. 2, the control circuit 250 can detect that an error occurred by either receiving an error message from the decode circuitry 210 or by computing the ECC itself. In any case, the control circuit 250 can modify the select line 252 of the multiplexor 230 in order to switch from a parallel mode of operation to a serial mode of operation, wherein the decode circuitry 210 is coupled in series to the decryption circuitry 220. In process block 450, the memory data is corrected using the decode circuitry and the corrected memory data is injected or fed into the decryption circuitry. For example, in FIG. 2, the decode circuitry 210 outputs the corrected memory data (which is still encrypted) that passes through the multiplexor 230 to the decryption circuitry 220. The memory data provided from the decode circuitry can then be decrypted and output to the processor 110 for consumption. When the ECC error is detected, the decrypted memory data that was derived from encrypted memory data 150 can be discarded. Once there is no more memory data in the decode circuitry 210, as indicated by the empty signal 290, the control circuit 250 can switch back to a parallel mode of operation.

Figure 5:
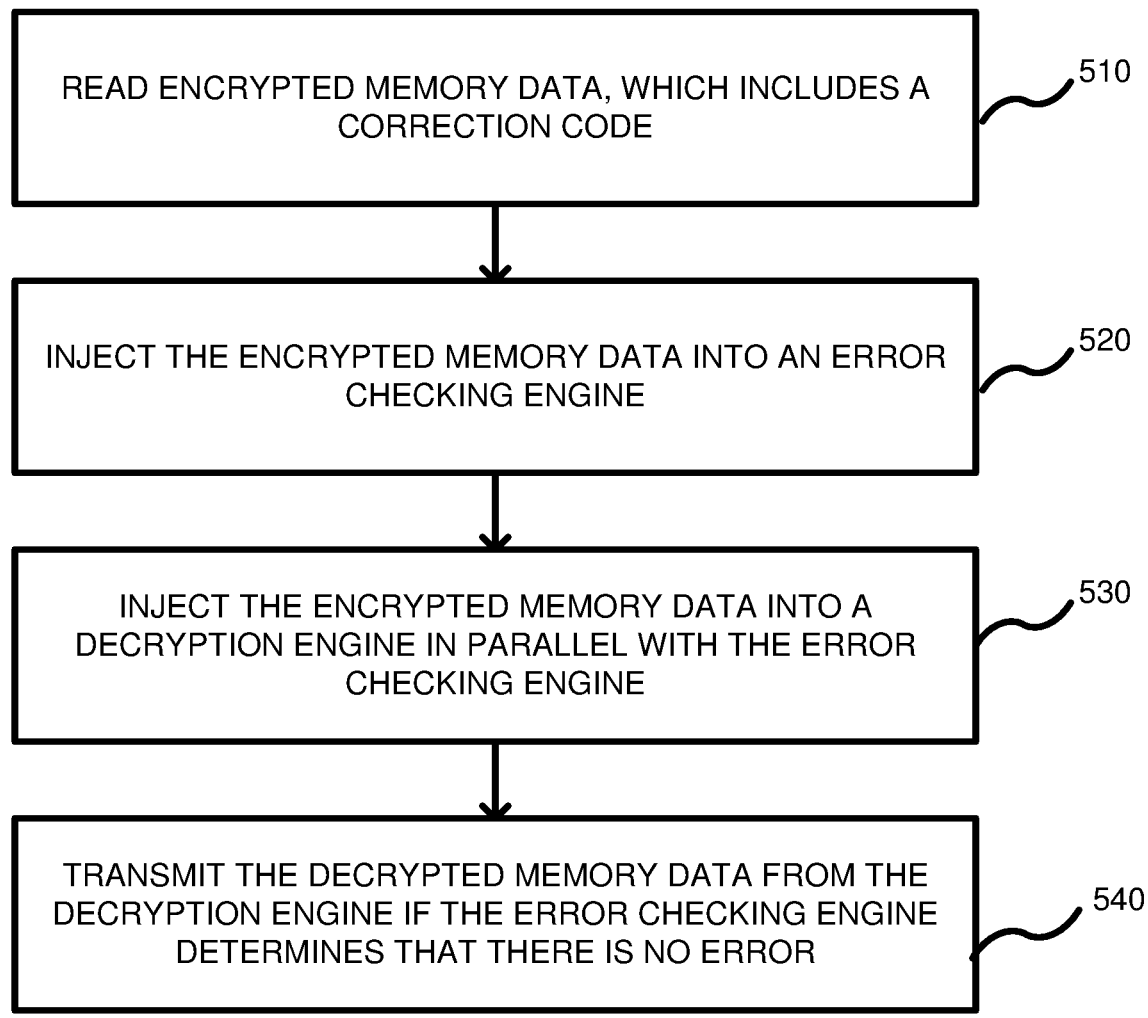
FIG. 5 is a flowchart according to another embodiment for parallel operation of decoding and decryption.

FIG. 5 is another embodiment for error checking and decrypting memory data. In process block 510, memory data is read, wherein the memory data is encrypted and includes a correction code. For example, in FIG. 2, the memory controller 130 includes circuitry for reading the encrypted memory data 150. The circuitry can include the decode circuitry 210 and the decryption circuitry 220. In process block 520, the encrypted memory data is injected or fed into an error checking engine. For example, in FIG. 3, the encrypted data is within the pipeline 310 and can be injected or fed into the error checking circuitry 330 to determine whether the data has an error. In process block 530, the encrypted memory data is also injected into a decryption engine in parallel with the error checking engine. For example, in FIG. 2 the decryption circuitry 220 receives the same data as the decode circuitry 210 at approximately a same time. In process block 540, the decrypted memory data is transmitted from the decryption engine if the error checking engine determines that there is no error. For example, in FIG. 2, if the decode circuitry 210 determines that there is no error, then the output 231 of the decode circuitry is discarded and no action is taken. Consequently, an output of the decryption circuitry 220 is transmitted on output 240. On the other hand, if the decode circuitry detects an error, then the control circuit 250 switches modes and ensures that the output of the decryption circuit is discarded as shown at 284.

Figure 6:
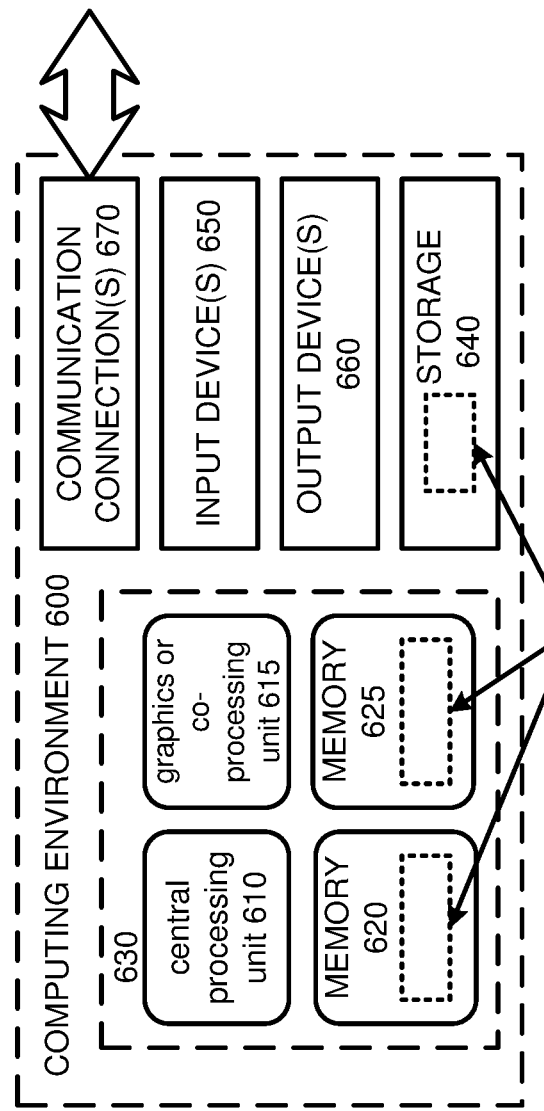
FIG. 6 depicts a generalized example of a suitable computing environment in which the described innovations may be implemented.

FIG. 6 depicts a generalized example of a suitable computing environment 600 in which the described innovations may be implemented. The computing environment 600 is not intended to suggest any limitation as to scope of use or functionality, as the innovations may be implemented in diverse general-purpose or special-purpose computing systems. For example, the computing environment 600 can be any of a variety of computing devices (e.g., desktop computer, laptop computer, server computer, tablet computer, etc.). The computing environment 600 can include the circuitry described herein, such as the components shown in FIG. 1.

With reference to FIG. 6, the computing environment 600 includes one or more processing units 610, 615 and memory 620, 625. In FIG. 6, this basic configuration 630 is included within a dashed line. The processing units 610, 615 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 6 shows a central processing unit 610 as well as a graphics processing unit or co-processing unit 615. The tangible memory 620, 625 may be volatile memory (e.g., registers, cache, RAM), non-volatile memory (e.g., ROM, EEPROM, flash memory, etc.), or some combination of the two, accessible by the processing unit(s). The memory 620, 625 stores software 680 implementing one or more innovations described herein, in the form of computer-executable instructions suitable for execution by the processing unit(s). The memory 625 can correspond to the memory 120 of FIG. 1.

A computing system may have additional features. For example, the computing environment 600 includes storage 640, one or more input devices 650, one or more output devices 660, and one or more communication connections 670. An interconnection mechanism (not shown) such as a bus, controller, or network interconnects the components of the computing environment 600. Typically, operating system software (not shown) provides an operating environment for other software executing in the computing environment 600, and coordinates activities of the components of the computing environment 600.

The tangible storage 640 may be removable or non-removable, and includes magnetic disks, magnetic tapes or cassettes, CD-ROMs, DVDs, or any other medium which can be used to store information in a non-transitory way and which can be accessed within the computing environment 600. The storage 640 stores instructions for the software 680 implementing one or more innovations described herein.

The input device(s) 650 may be a touch input device such as a keyboard, mouse, pen, or trackball, a voice input device, a scanning device, or another device that provides input to the computing environment 600. The output device(s) 660 may be a display, printer, speaker, CD-writer, or another device that provides output from the computing environment 600.

The communication connection(s) 670 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier. The communication channel can be used to implement on or more innovations described herein.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

What is claimed is:

1. A method of error checking and decrypting memory data, the method comprising:
   in a parallel mode of operation, in a memory controller, receiving memory data, which is encrypted, and feeding the memory data into decode circuitry and into decryption circuitry in parallel;
   in the decode circuitry, using an Error Correction Code (ECC) check to determine whether the memory data has an error;
   in the decryption circuitry, decrypting the memory data to generate decrypted memory data;
   as a result of determining that the memory data has an error, switching to a serial mode of operation wherein an output of the decode circuitry is coupled to an input of the decryption circuitry;
   correcting the memory data using the decode circuitry to produce corrected memory data, and feeding the corrected memory data into the decryption circuitry; and
   decrypting the corrected memory data.

2. The method of claim 1, further including discarding the decrypted memory data when the error is detected and using the decrypted corrected memory data.

3. The method of claim 1, further including discarding an output of the decode circuitry when in the parallel mode of operation.

4. The method of claim 1, wherein the memory controller is within a processor coupled to a memory that includes the memory data.

5. The method of claim 1, further including detecting that the decode circuitry has no more memory data to decode in the serial mode of operation and, in response to the detecting, switching to the parallel mode of operation wherein the output of the decode circuitry is decoupled from the input of the decryption circuitry.

6. A method, comprising:
   reading encrypted memory data from a memory, the encrypted memory data including a correction code;
   injecting the encrypted memory data into an error checking engine that uses the correction code to determine whether the encrypted memory data has an error;
   injecting the encrypted memory data into a decryption engine in parallel with the error checking engine; and
   transmitting decrypted memory data from the decryption engine if the error checking engine determines that there is no error in the encrypted memory data.

7. The method of claim 6, wherein the injecting the encrypted memory data into the error checking engine and the decryption engine is in a parallel mode of operation of an integrated circuit (IC) and the transmitting is to a processor coupled to the IC.

8. The method of claim 7, further including detecting that the encrypted memory data has the error and switching the IC to a serial mode of operation wherein an output of the error checking engine is coupled to an input of the decryption engine.

9. The method of claim 7, wherein an output of the error checking engine is discarded in the parallel mode of operation if no error is detected.

10. The method of claim 8, further including detecting in the serial mode of operation that the error checking engine has no further encrypted memory data and, in response, switching back to the parallel mode of operation.

11. The method of claim 6, wherein the correction code is an error correction code (ECC) using Reed-Solomon coding, Hamming coding, or Golay coding.

12. The method of claim 6, wherein the error checking engine and the decryption engine are within a memory controller that includes a parallel mode of operation wherein the error checking engine and the decryption engine are coupled in parallel, and a serial mode of operation, wherein an output of the error checking engine is coupled to an input of the decryption engine.

13. The method of claim 6, further comprising disregarding the decrypted memory data if the error checking engine determines that there is an error in the encrypted memory data.

14. The method of claim 6, further including controlling a multiplexer based on whether the error checking engine determines that there is an error in the encrypted memory data, the multiplexer controlling whether the error checking engine and decryption engine are coupled in parallel or series.

15. An integrated circuit (IC), comprising:
   a decryption engine coupled to receive input memory data from a memory;
   an error checking engine coupled to the decryption engine to receive the input data from the memory in parallel with the decryption engine, the error checking engine configured to perform an Error Correction Code (ECC) check; and
   a control circuit coupled to the decryption engine and the error checking engine, the control circuit for controlling whether the decryption engine outputs decrypted memory data based on an output from the error checking engine.

16. The IC of claim 15, further including a multiplexer having a first input coupled to receive the input data from the memory, a second input coupled to an output of the error checking engine, and an output coupled to an input of the decryption engine.

17. The IC of claim 16, wherein the control circuit is coupled to a select line of the multiplexer for switching between a parallel mode and a serial mode, wherein in a parallel mode, the error checking engine and the decryption engine are coupled in parallel and in a serial mode, the error checking engine and decryption engine are coupled in series.

18. The IC of claim 15, wherein the IC is a processor having an embedded memory controller.

19. The IC of claim 15, wherein the memory is a Dynamic Random Access Memory (DRAM).

20. The IC of claim 15, wherein the IC is a memory controller.

* * * * *